(12) United States Patent
Lee (10) Patent No.: US 7,732,250 B2
(45) Date of Patent: Jun. 8, 2010

(54) METHODS OF FORMING PHASE CHANGEABLE LAYERS INCLUDING PROTRUDING PORTIONS IN ELECTRODES THEREOF

(75) Inventor: Se-Ho Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/114,443

(22) Filed: May 2, 2008

(65) Prior Publication Data

US 2008/0206921 A1 Aug. 28, 2008

Related U.S. Application Data

(62) Division of application No. 10/692,578, filed on Oct. 24, 2003, now Pat. No. 7,385,218.

(30) Foreign Application Priority Data

Oct. 25, 2002 (KR) ................................ 2002-65456

(51) Int. Cl.
*H01L 21/06* (2006.01)
(52) U.S. Cl. ........................ 438/102; 438/239; 438/243
(58) Field of Classification Search .................. 438/102
See application file for complete search history.

(56) References Cited

U.S. PATENT DOCUMENTS

| 5,831,276 A | 11/1998 | Gonzalez et al. |
| 6,844,268 B1 | 1/2005 | Sugaya |
| 2002/0175322 A1 | 11/2002 | Doan et al. |

*Primary Examiner*—Long Pham
(74) *Attorney, Agent, or Firm*—Myers Bigel Sibley & Sajovec, P.A.

(57) ABSTRACT

A method of forming a structure in a phase changeable memory cell can include forming a bottom electrode having an interlayer dielectric layer thereon, the bottom electrode having a recess therein that extends beyond a boundary between the bottom electrode and the interlayer dielectric. A phase changeable layer can be formed in the recess including a protruding potion of the phase changeable layer that protrudes into the bottom electrode beyond the boundary.

12 Claims, 6 Drawing Sheets

Fig. 1

(PRIOR ART)

METHODS OF FORMING PHASE CHANGEABLE LAYERS INCLUDING PROTRUDING PORTIONS IN ELECTRODES THEREOF

CLAIM FOR PRIORITY

This application is a Divisional of, and claims priority to U.S. patent application Ser. No. 10/692,578, filed on Oct. 24, 2003, now U.S. Pat. No. 7,385,218 and to Korean Patent Application No. 2002-65456, filed on Oct. 25, 2002, the disclosures of which are incorporated herein by reference in their entireties.

FIELD OF THE INVENTION

The invention relates to nonvolatile memory devices and methods of fabricating the same and, more particularly, to phase changeable memories and methods of forming phase changeable memories.

BACKGROUND

Nonvolatile memory devices can retain data stored therein even when power thereto is interrupted. Some nonvolatile memory devices employ flash memory cells having stacked gate structures. Each of the stacked gate structures can include a tunnel oxide layer, a floating gate, an inter-gate dielectric layer and a control gate electrode, which can be sequentially stacked on a channel region. The reliability and program efficiency of the flash memory cell may be improved by improving the film quality of the tunnel oxide layer and increasing the coupling ratio of the cells.

Figure 1:
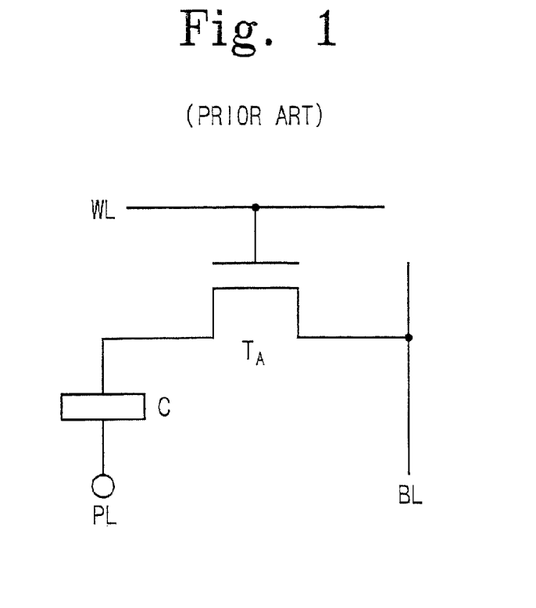
FIG. 1 is an equivalent circuit diagram of a conventional phase changeable memory cell.

Phase changeable memory devices are also known. FIG. 1 is an equivalent circuit of a typical phase changeable memory cell. Referring to FIG. 1, the phase changeable memory cell can include an access transistor $T_A$ and a variable resistor C, which are serially connected to each other. The variable resistor C can provide a data storage element that includes a bottom electrode, a top electrode and a phase changeable material layer interposed between the bottom electrode and the top electrode. The top electrode of the variable resistor C is connected to a plate electrode PL. The access transistor $T_A$ includes a source region connected to the bottom electrode, a drain region spaced apart from the source region and a gate electrode located over a channel region between the source and drain regions. The gate electrode and the drain region are electrically connected to a word line WL and a bit line BL, respectively. As a result, an equivalent circuit of the phase changeable memory cell may include elements/components that are similar to those included in some dynamic random access memory (DRAM) cells. However, a property of the phase changeable material layer is different from that of a dielectric layer which is sometimes included in capacitors of DRAM cells. That is to say, the phase changeable material layer exhibits two stable states according to a temperature.

Figure 2:
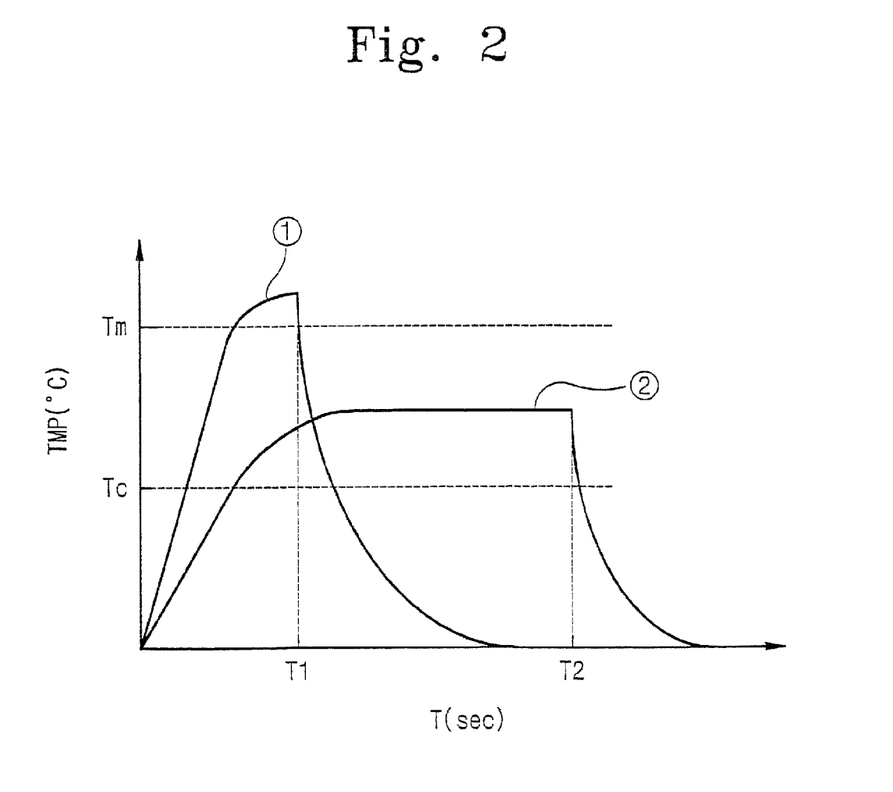
FIG. 2 is a graph for illustrating exemplary properties of a phase changeable material used in conventional phase changeable memory cells.

FIG. 2 is a graph that illustrates a property of the phase changeable material layer. The abscissa represents time T and the ordinate represents temperature TMP applied to the phase changeable material layer. Referring to FIG. 2, if the phase changeable material layer is heated to a temperature that is greater than the melting point Tm for a first duration T1 and cooled down rapidly, the phase changeable material layer is transformed into an amorphous state (refer to curve ①).

Alternatively, if the phase changeable material layer is heated to a temperature that is in the range between the crystallization temperature Tc of the phase changeable material and the melting temperature Tm for a second duration T2 (greater than the first duration T1) and is cooled down, the phase changeable material layer is transformed into a crystalline state (refer to curve ②). The resistivity of the phase changeable material layer having the amorphous state is greater than that of the phase changeable material layer in the crystalline state. Thus, it is possible to determine whether the information stored in the memory cell is a logic "1" or a logic "0" by detecting the current that flows through the phase changeable material layer in a read mode. A compound material layer containing germanium (Ge), stibium (Sb) and tellurium (Te) (hereinafter, referred to as a GST layer) is widely used as the phase changeable material layer.

Figure 3:
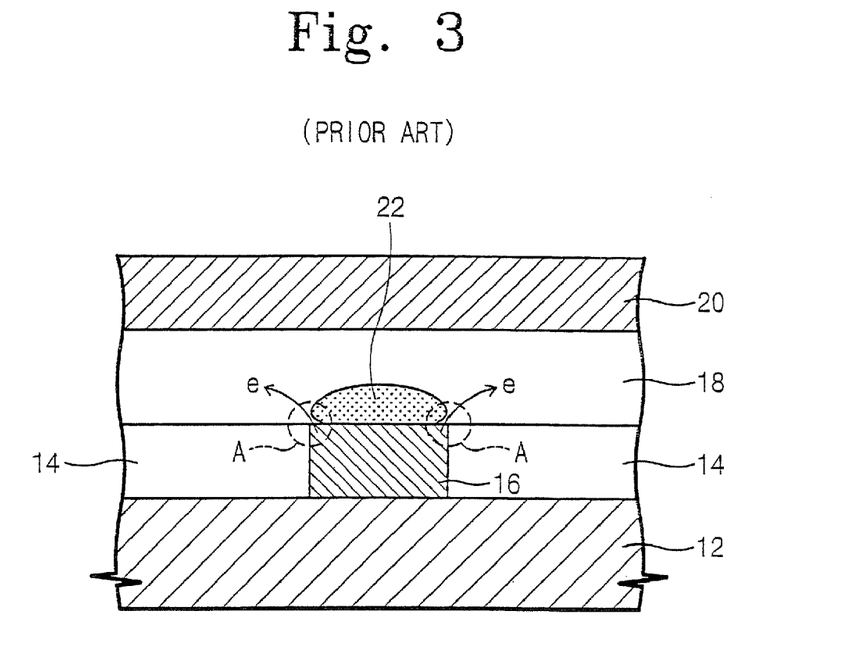
FIG. 3 is a cross sectional view that illustrates a portion of a conventional phase changeable memory cell.

FIG. 3 is a cross sectional view illustrating a data storage element of conventional phase changeable memory device. Referring to FIG. 3, a conventional phase changeable memory includes an interlayer dielectric layer 14 on a semiconductor substrate (not shown) having a contact plug 16 and a bottom electrode 12 therein. The contact plug 16 extends through the interlayer dielectric layer 14 so as to contact the bottom electrode 12. A phase changeable layer 18 is on the contact plug 16 and the interlayer dielectric layer 14. An upper electrode 20 is on the phase changeable layer 18.

Because the phase changeable layer 18 is on the contact plug 16, a normal profile of the contact between the phase changeable layer 18 and the contact plug 16 can extend in a vertical direction. When heat is generated by the contact resistance at a contact portion between the contact plug 16 and the phase changeable layer 18, the central region 22 of the contact portion may remain at a high temperature. However, an edge region A of the contact portion may be maintained lower than a temperature necessary to change the phase of the phase changeable layer 18 due to, for example, heat leakage into the interlayer dielectric layer 14 around the contact portion. This may result in the generation of abnormal regions A where the respective phase of the region is not fully changed to an amorphous state. Such abnormal regions A may commonly be found at the edge of the contact portion, where charge leakage e can occur. Such charge leakage may lead to errors in the retention of data within the phase changeable memory cell.

SUMMARY

Embodiments according to the invention can provide methods of forming structures in phase changeable memory cells. Pursuant to these embodiments, a method of forming a structure in a phase changeable memory cell can include forming a bottom electrode having an interlayer dielectric layer thereon, the bottom electrode having a recess therein that extends beyond a boundary between the bottom electrode and the interlayer dielectric. A phase changeable layer can be formed in the recess including a protruding potion of the phase changeable layer that protrudes into the bottom electrode beyond the boundary.

In some embodiments according to the invention, forming the bottom electrode can further include forming the interlayer dielectric layer on the bottom electrode and isotropically etching the interlayer dielectric layer to form a mouth of the contact hole. The interlayer dielectric layer can be anisotropically etched though the mouth of the contact hole to beyond the boundary to form the recess in the bottom electrode a recess width that is less than the mouth width.

DESCRIPTION OF EMBODIMENTS ACCORDING TO THE INVENTION

The invention is described herein with reference to the accompanying drawings, in which exemplary embodiments of the invention are shown. Like numbers refer to like elements. In the figures, certain features, layers or components may be exaggerated for clarity. Also, in the figures, broken lines can indicate optional features or components unless stated otherwise. When a layer is referred to as being "on" another layer or substrate, it can be directly on the other layer or substrate, or intervening layers, films, coatings and the like may also be present unless the word "directly" is used which indicates that the feature or layer directly contacts the feature or layer.

Spatially relative terms, such as "beneath", "below", "lower", "above", "upper", "bottom", "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

Figure 4:
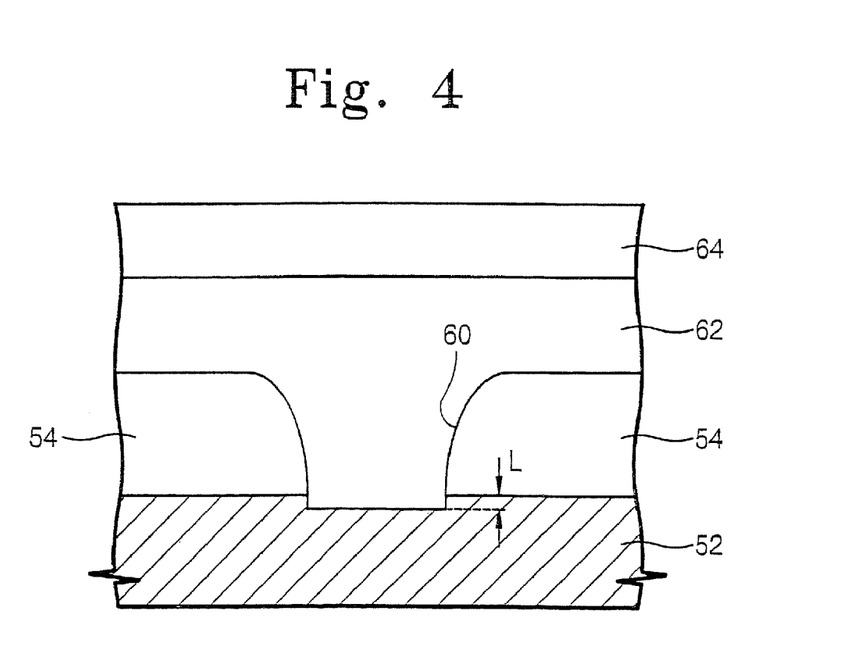
FIG. 4 is a schematic cross-sectional view that illustrates some embodiments of phase changeable memory cells according to the invention.

FIG. 4 is a schematic cross-sectional view that illustrates embodiments of phase changeable memory cells according to the invention. Referring to FIG. 4, a phase changeable memory cell according to embodiments of the invention can include a bottom electrode 52 disposed on an integrated circuit substrate (such as a semiconductor substrate), and an interlayer dielectric layer 54 disposed on the bottom electrode 52. The interlayer dielectric layer 54 includes a contact hole 60 that exposes a portion of the bottom electrode 52. Furthermore, the contact hole 60 extends into the bottom electrode 52 to define a recess therein. The bottom electrode 52 may be formed of one or more of titanium nitride (TiN), titanium aluminum nitride (TiAlN), titanium silicon nitride (TiSiN), tantalum aluminum nitride (TaAlN), and tantalum silicon nitride (TaSiN).

A phase changeable layer 62 is disposed on the interlayer dielectric layer 54 and extends through the contact hole 60 to contact the bottom electrode 52. The phase changeable layer 62 extends a predetermined depth L beyond a boundary between the bottom electrode 52 and the interlayer dielectric layer 54 into the bottom electrode 52, so that a portion of the phase changeable layer 62 protrudes into the bottom electrode 52 to contact the bottom electrode 52 in three dimensions. In other words, a protruding portion of the phase changeable layer 62 extends into the bottom electrode 52 so that sidewalls of the protruding portion and a lower surface of the protruding portion contact the bottom electrode 52.

A top electrode 64 is formed on the phase changeable layer 62. The top electrode 64 may include one or more of titanium nitride (TiN), titanium aluminum nitride (TiAlN), titanium silicon nitride (TiSiN), tantalum aluminum nitride (TaAlN), and tantalum silicon nitride (TaSiN).

Figure 5:
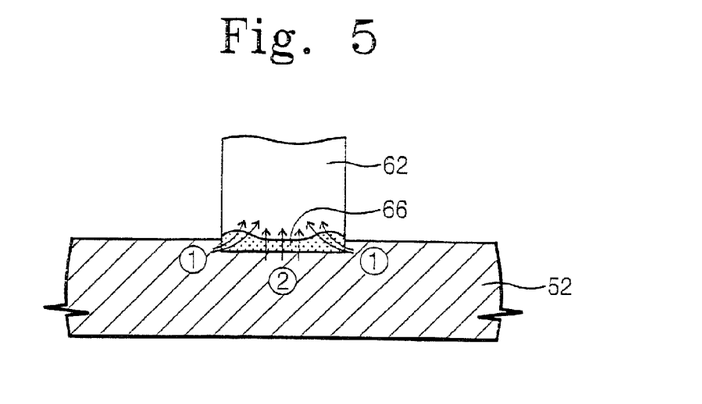
FIG. 5 is a schematic cross-sectional view that illustrates phase change effects associated with some embodiments of phase changeable memory cells according to the invention.

FIG. 5 is a schematic cross-sectional view that illustrates a phase change effect of the phase changeable memory cell illustrated in FIG. 4. Referring to FIG. 5, if heat is generated at a boundary (or interface) region between the bottom electrode 52 and the phase changeable layer 62 in a program or erase operation, the phase changeable layer 62 is transformed into an amorphous state or a crystalline state. As described above, the phase changeable memory cell contacts the bottom electrode 52 in three dimensions. Such contact can allow heat transmission (or heating) at an edge region 1 of the contact to the phase changeable layer 62, as well as heat transmission (or heating) at a central region 2 of the contact to the phase changeable layer 62, to change the phase of the phase changeable layer 62. In some embodiments according to the invention, the contact depth L is less than a distance which allows the heat generated at the contact portion to change the state of the phase changeable layer 62.

Figure 6:
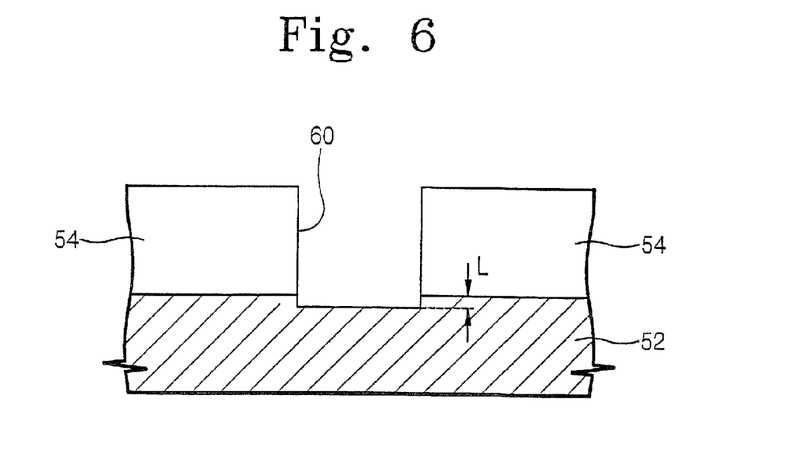
FIGS. 6 to 11 are cross-sectional views that illustrate some embodiments of methods of forming phase changeable memory cells according to the invention.
Figure 7:
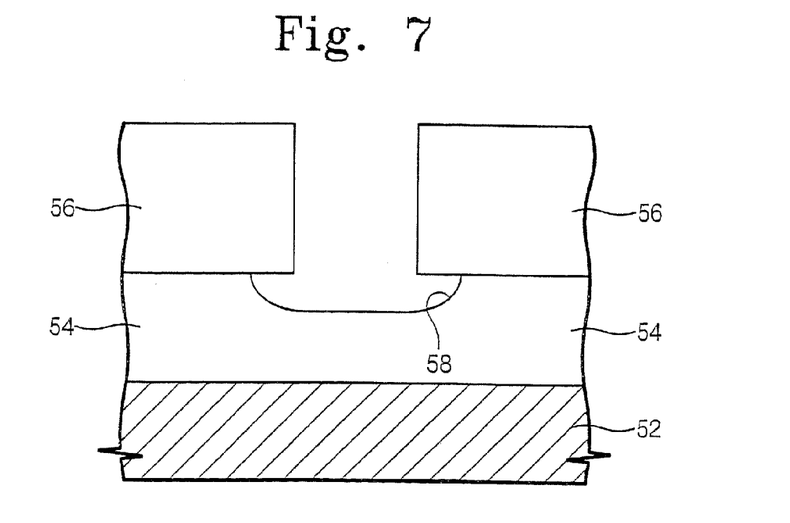

FIGS. 6 to 11 are cross-sectional views that illustrate method embodiments of forming phase changeable memory cells according to the invention. Referring to FIG. 6, a bottom electrode 52 is formed on a substrate. The bottom electrode 52 may include one or more of titanium nitride (TiN), titanium aluminum nitride (TiAlN), titanium silicon nitride (TiSiN), tantalum aluminum nitride (TaAlN) and tantalum silicon nitride (TaSiN). A interlayer dielectric layer 54 is formed on the bottom electrode 52 and patterned to form a contact hole 60 exposing a portion of the bottom electrode 52. The bottom electrode 52 exposed by the contact hole 60 is etched to depth L so that a portion of the side wall of the contact hole 60 is located beneath a surface of the bottom electrode 52.

In some embodiments according to the invention, the contact hole 60 is formed to a tapered profile so that the contact hole 60 has an upper width that is wider than a lower width as shown, for example in FIGS. 7-11. In particular, in some embodiments according to the invention, an interlayer dielectric layer 54 is formed on the bottom electrode 52, and a photo resist pattern 56 is formed on the interlayer dielectric layer 54. The photo resist pattern 56 exposes a portion of the interlayer dielectric layer 54 over the bottom electrode 52. The interlayer dielectric layer 54 is etched to form a recess region 58 therein by using the photo resist pattern 56 as etch mask. The interlayer dielectric layer 54 is etched by isotropic etching, thereby forming the recess region 58 to define a mouth of a subsequently formed contact hole. The mouth can have a width that is wider than that of the exposed region of the interlayer dielectric layer 54.

Figure 8:
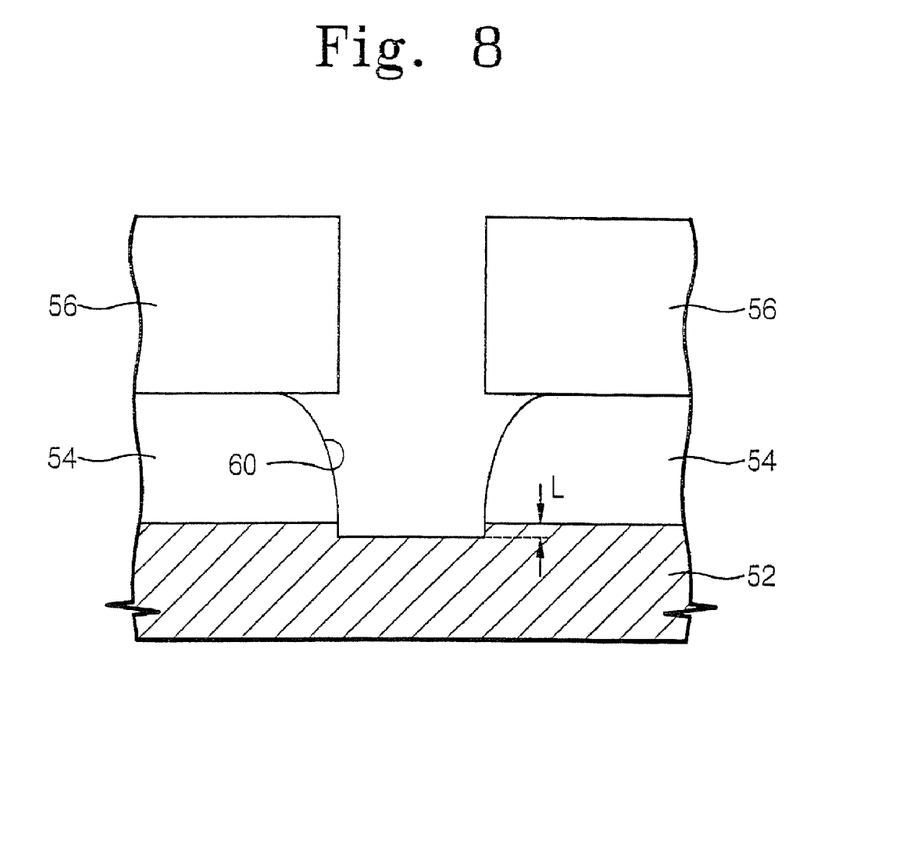

Referring to FIG. 8, the interlayer dielectric layer 54 is etched to expose the bottom electrode 52 using the photo resist pattern as etch mask. The interlayer dielectric layer 54 may be etched using anisotropic etching thereby forming the contact hole 60 exposing a portion of the bottom electrode 52. As a result, the upper width (or mouth width) of the contact hole 60 is wider than a lower width of the contact hole 60 since isotropic etching and anisotropy etching are performed sequentially to form the contact hole 60.

Referring still to FIG. 8, the bottom electrode 52 is etched to predetermined depth L so that a portion of the side wall of the contact hole 60 is formed beneath a surface of the bottom electrode 52. The width of the recess in the bottom electrode can be less than the mouth of the contact hole. In some embodiments according to the invention, the etched depth L of the bottom electrode 52 is formed to a depth that is shallower than (or less than) a distance which allows the heat generated at the contact portion to change the state of the subsequently formed phase changeable layer.

Figure 9:
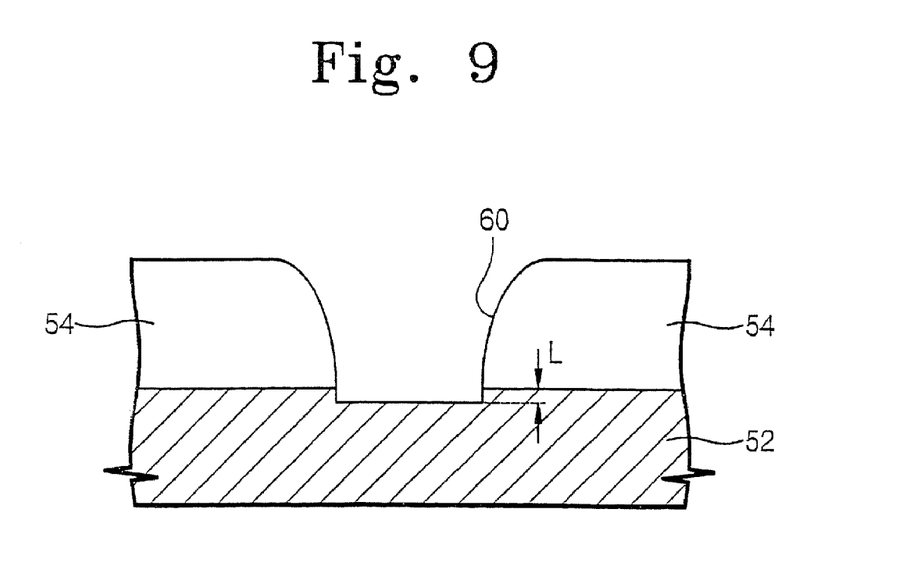
Figure 10:
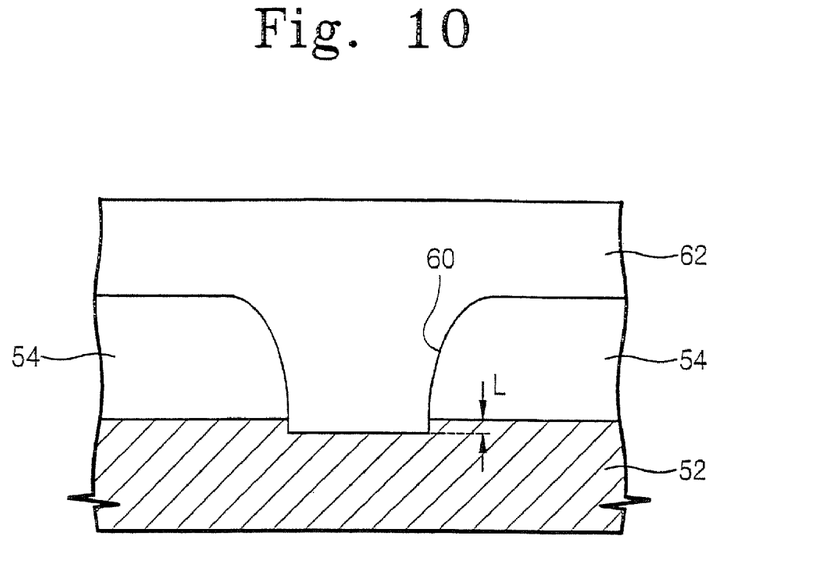

Referring to FIGS. 9 and 10, the photo resist pattern 56 is removed and a phase changeable layer 62 is formed on the interlayer dielectric layer 54 and in the contact hole 60 to contact the bottom electrode 52. The phase changeable layer 62 is formed on the side wall of the contact hole 60 to form a side wall of phase changeable layer 62 in the contact hole 60 that contacts the bottom electrode 52 since the bottom electrode 52 is etched to a depth L beyond a boundary between the bottom electrode 52 and the interlayer dielectric layer 54 into the bottom electrode 52.

Figure 11:
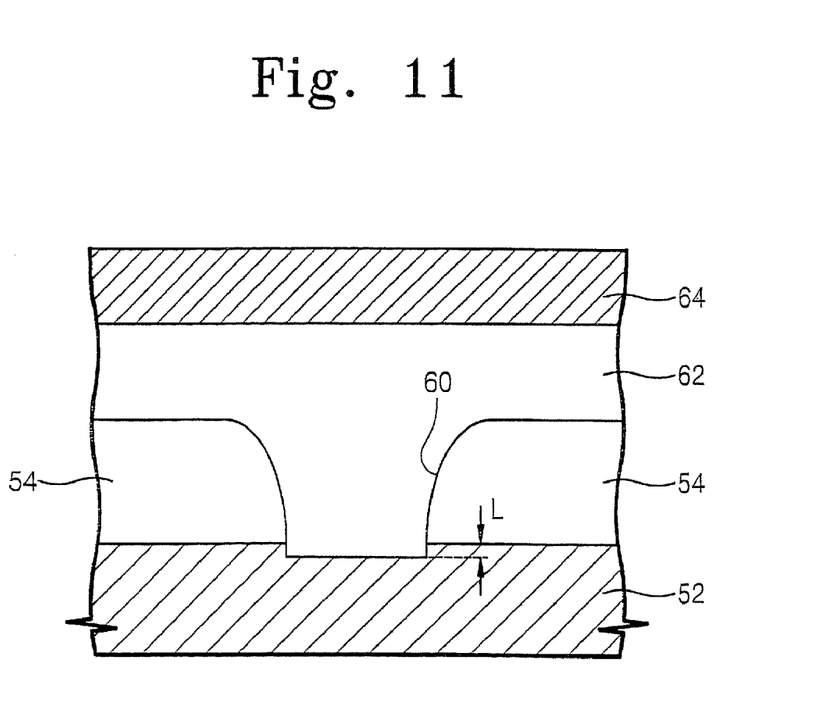

Referring FIG. 11, a conductive layer 64 is formed on the phase changeable layer 62. In some embodiments according to the invention, the conductive layer 74 includes one or more of titanium nitride (TiN), titanium aluminum nitride (TiAlN), titanium silicon nitride (TiSiN), tantalum aluminum nitride (TaAlN) and tantalum silicon nitride (TaSiN). The conductive layer 74 and the phase changeable layer 62 are patterned to form a data storage element on the bottom electrode 52. The data storage element includes the phase changeable pattern and upper electrode.

Figure 12:
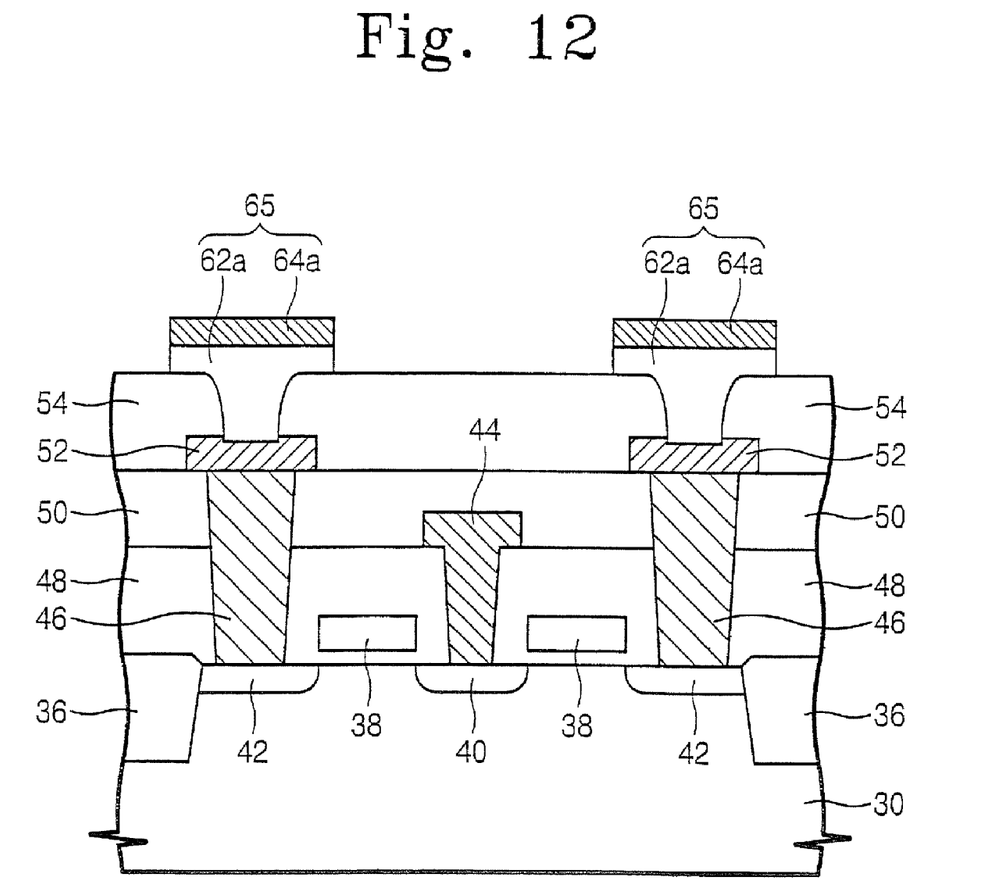
FIG. 12 is a cross-sectional view that illustrates some embodiments of phase changeable memory cells according to the invention.

FIG. 12 is a cross-sectional view that illustrates some embodiments of phase changeable memory cells according to the invention. Referring to FIG. 12, the phase changeable memory cell includes a data storage element of a phase changeable material layer that can be used to store data. Phase changeable memory cells according to some embodiments of the invention can be formed by forming device isolation layers 36 to define active regions, and forming a pair of parallel word lines 38 crossing over the active regions. Impurity regions are formed in the active region on both sides of the word lines 38. A impurity region in the active region between the word lines 38 corresponds to common drain region 40, and impurity regions at both sides of the common drain region 40 corresponds to source regions 42.

A first interlayer dielectric layer 48 is formed on a surface of an integrated circuit substrate having the device isolation layer 36, the word lines 38, the common drain region 40 and the source regions 42 formed therein. A bit line 44 is formed on the first interlayer dielectric layer 48 to contact the common drain region 40. Although only a portion of the bit line 44 is shown in the figures, it will be understood that the bit line 40 crosses over the first interlayer dielectric layer 48.

A second interlayer dielectric layer 50 is formed on the semiconductor substrate on which the bit line 44 is formed. Storage node plugs 46 are formed. The respective storage node plugs 46 extend through the second interlayer dielectric layer 50 and the first interlayer dielectric layer 48 to contact the respective source regions 42. Bottom electrodes 52 are formed on the storage node plugs 46. The bottom electrodes 52 may include one or more of titanium nitride (TiN), titanium aluminum nitride (TiAlN), titanium silicon nitride (TiSiN), tantalum aluminum nitride (TaAlN) and tantalum silicon nitride (TaSiN).

A third interlayer dielectric layer 54 is formed on the second interlayer dielectric layer 50 and on the bottom electrode 52. As disclosed above in reference to FIGS. 4-11, data storage elements 65, which are electrically connected to the bottom electrodes 52, are formed on the third interlayer dielectric layer 54. The data storage element 65 include a phase changeable pattern 62a and an upper electrode 64a.

In some embodiments according to the invention, the phase changeable pattern 62a may be formed to directly contact the storage node plug 46, instead of forming the bottom electrode 52, so that the storage node plug 46 functions as the bottom electrode. In such embodiments according to the invention, the storage node plug 46 is formed of one or more of the following materials: titanium nitride (TiN), titanium aluminum nitride (TiAlN), titanium silicon nitride (TiSiN), tantalum aluminum nitride (TaAlN) or tantalum silicon nitride (TaSiN). The third interlayer dielectric layer 54 is formed on the storage node plug 46, and a contact hole is formed as disclosed in reference to FIGS. 4 to 9 so that the phase changeable layer may have electrical contact with the bottom electrode in three dimensions.

According to some embodiments of the present invention, a phase changeable layer is extended (or protrudes) into the bottom electrode to a depth. Therefore, the phase changeable memory cell may have electrical contact with the bottom electrode in three dimensions. For example, a side wall of a phase changeable layer formed in a contact hole that extends beyond a boundary with the bottom electrode to a depth into the bottom electrode, can provide increased surface contact between the electrode and the phase changeable layer. Such an increased contact surface can allow heat transmission from the side wall contact as well as heat transmission from the bottom contact to supplement a heat loss at the edge region of the contact surface and reduce temperature difference between the edge region and the central region of the contact surface. Therefore, it may be possible to reduce the likelihood that the state of the phase changeable layer may not change from an amorphous state or a crystalline state due to heat loss at the edge region of the contact surface.

What is claimed:

1. A method of forming a structure in a phase changeable memory cell, comprising:

forming a bottom electrode having an interlayer dielectric layer thereon, the bottom electrode having a recess therein that extends beyond a boundary between the bottom electrode and the interlayer dielectric, wherein the interlayer dielectric layer is formed after the bottom electrode; and forming a phase changeable layer in the recess including a protruding potion of the phase changeable layer that protrudes into the bottom electrode beyond the boundary.

2. A method of forming a structure in a phase changeable memory cell, comprising:

forming a bottom electrode having an interlayer dielectric layer thereon, the bottom electrode having a recess therein that extends beyond a boundary between the bottom electrode and the interlayer dielectric; and forming a phase changeable layer in the recess including a protruding potion of the phase changeable layer that protrudes into the bottom electrode beyond the boundary, wherein forming a bottom electrode further comprises:

forming the interlayer dielectric layer on the bottom electrode;

isotropically etching the interlayer dielectric layer to form a mouth of the contact hole having a mouth width; and anisotropically etching the interlayer dielectric layer though the mouth of the contact hole to beyond the boundary to form the recess in the bottom electrode a recess width that is less than the mouth width.

3. A method according to claim 1 wherein the recess extends beyond the boundary by a depth to define a side wall of the recess that contacts the protruding portion of the phase changeable layer, wherein the depth is defined to limit an amount of heat transmission from the bottom electrode to the phase changeable layer across the side wall to less than an amount sufficient to cause the phase changeable layer to change phase between a crystalline state and an amorphous slate.

4. A method according to claim 1 wherein the interlayer dielectric layer includes a contact hole with the phase changeable layer therein on the recess.

5. A method according to claim 4 wherein the contact hole has an inward tapered profile extending toward the bottom electrode that defines an opening that is narrower at in the recess than away from the recess.

6. A method of fabricating a phase changeable memory cell, comprising:
   forming a plurality of bottom electrodes on a silicon substrate;
   forming a interlayer dielectric layer on the semiconductor substrate having the bottom electrodes;
   patterning the interlayer dielectric layer to form a plurality of contact holes exposing a portion of the bottom electrodes, respectively,
   etching the bottom electrodes exposed in the contact holes to predetermined depth; and
   forming a plurality of data storage elements on the interlayer dielectric layer, the data storage element is filled in the contact hole and the etched region of the bottom electrode to connect with the bottom electrode, wherein forming the contact holes comprising:
   isotropic etching a portion of the interlayer dielectric layer to form recess regions over the bottom electrodes; and
   anisotropic etching the interlayer dielectric layer at the recess regions to form contact holes exposing a portion of each bottom electrode, respectively,
   wherein exposed region of the bottom electrode is formed to an width which is narrower than that of the recess region.

7. A method of fabricating a phase changeable memory cell, comprising:
   forming a plurality of bottom electrodes on a silicon substrate;
   forming a interlayer dielectric layer on the semiconductor substrate having the bottom electrodes;
   patterning the interlayer dielectric layer to form a plurality of contact holes exposing a portion of the bottom electrodes, respectively,
   etching the bottom electrodes exposed in the contact holes to predetermined depth; and
   forming a plurality of data storage elements on the interlayer dielectric layer, the data storage element is filled in the contact hole and the etched region of the bottom electrode to connect with the bottom electrode, wherein forming the contact holes comprising:
   isotropic etching a portion of the interlayer dielectric layer to form recess regions over the bottom electrodes; and
   anisotropic etching the interlayer dielectric layer at the recess regions to form contact holes exposing a portion of each bottom electrode, respectively,
   wherein forming the contact holes comprising:
   forming a photo resist pattern on the interlayer dielectric layer, wherein the photo resist pattern is formed to expose a portion of the interlayer dielectric layer over each of the bottom electrodes;
   isotropic etching a portion of the interlayer dielectric layer using the photo resist pattern as etch mask to form recess regions;
   anisotropic etching the interlayer dielectric layer using the photo resist pattern to form a portion of each bottom electrodes; and
   removing the photo resist pattern.

8. A method of fabricating a phase changeable memory cell, comprising:
   forming a plurality of bottom electrodes on a silicon substrate;
   forming a interlayer dielectric layer on the semiconductor substrate having the bottom electrodes;
   patterning the interlayer dielectric layer to form a plurality of contact holes exposing a portion of the bottom electrodes, respectively,
   etching the bottom electrodes exposed in the contact holes to predetermined depth; and
   forming a plurality of data storage elements on the interlayer dielectric layer, the data storage element is filled in the contact hole and the etched region of the bottom electrode to connect with the bottom electrode, wherein forming the contact holes comprising:
   isotropic etching a portion of the interlayer dielectric layer to form recess regions over the bottom electrodes; and
   anisotropic etching the interlayer dielectric layer at the recess regions to form contact holes exposing a portion of each bottom electrode, respectively,
   wherein forming the data storage electrodes:
   forming a phase changeable layer, which is filled in the contact hole and the etched regions of the bottom electrodes, over an entire surface of the substrate having the contact holes;
   forming a conductive layer on the phase changeable layer;
   sequentially patterning the conductive layer and the phase changeable layer to form phase changeable patterns respectively connected with the bottom electrode and upper electrodes over the phase changeable patterns.

9. The method of claim 8, the conductive layer is formed of one selected form group comprising titanium nitride (TiN), titanium aluminum nitride (TiAlN), titanium silicon nitride (TiSiN), tantalum aluminum nitride (TaAlN) and tantalum silicon nitride (TaSiN).

10. A method of forming a structure in a phase changeable memory cell, comprising:
    forming a planar bottom electrode having an interlayer dielectric layer formed thereon, the planar bottom electrode having a recess therein that extends beyond a boundary between the planar bottom electrode and the interlayer dielectric wherein the interlayer dielectric layer includes a contact hole with the phase changeable layer therein on the recess, wherein the interlayer dielectric layer is formed after the bottom electrode; and
    forming a phase changeable layer in the recess including a protruding potion of the phase changeable layer that protrudes into the planar bottom electrode beyond the boundary wherein the contact hole has an inward tapered profile extending toward the planar bottom electrode that defines an opening that is narrower at a bottom of the recess than away from the recess.

11. A method according to claim 1 wherein a sidewall of the contact hole is coplanar with a sidewall of the recess.

12. A method according to claim 1 wherein the phase changeable layer directly contacts the interlayer dielectric layer.

* * * * *